United States Patent
Lian et al.

(10) Patent No.: US 10,218,098 B1
(45) Date of Patent: Feb. 26, 2019

(54) MODULE MOUNT INTERPOSER

(71) Applicant: Finisar Corporation, Sunnyvale, CA (US)

(72) Inventors: Jia Lian, Shanghai (CN); Huaping Peng, Shanghai (CN); Shamei Shi, Shanghai (CN); William H Wang, Pleasanton, CA (US); Frank Flens, Campbell, CA (US); Henricus Jozef Vergeest, Mountain View, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 15/688,402

(22) Filed: Aug. 28, 2017

(51) Int. Cl.
*H01R 12/70* (2011.01)
*H01R 12/71* (2011.01)

(52) U.S. Cl.
CPC ....... *H01R 12/7082* (2013.01); *H01R 12/716* (2013.01)

(58) Field of Classification Search
CPC .................... H01R 12/7082; H01R 12/716
USPC ........................................................ 439/74
See application file for complete search history.

(56) References Cited

U.S. PATENT DOCUMENTS

| | | | | |
|---|---|---|---|---|
| 5,211,567 A * | 5/1993 | Neumann | ............ | H01R 12/523 439/607.05 |
| 5,418,469 A * | 5/1995 | Turner | ............... | G01R 1/07328 324/72.5 |
| 5,474,458 A * | 12/1995 | Vafi | ............... | H01L 23/49827 257/E23.063 |
| 5,619,399 A * | 4/1997 | Mok | ............ | H01L 23/4006 257/718 |
| 5,713,744 A * | 2/1998 | Laub | ............ | H05K 7/1061 439/71 |
| 6,019,611 A * | 2/2000 | McHugh | ............ | H01R 13/2435 439/515 |
| 6,050,832 A * | 4/2000 | Lee | ............... | H01L 23/49833 257/E23.063 |
| 6,257,904 B1 * | 7/2001 | Lin | ............ | H05K 1/141 439/67 |
| 6,280,202 B1 * | 8/2001 | Alden, 3rd | ............ | H05K 7/142 174/138 D |
| 6,335,491 B1 * | 1/2002 | Alagaratnam | .... | H01L 23/49827 174/260 |
| 6,344,684 B1 * | 2/2002 | Hussain | ............... | G01R 1/0483 257/690 |

(Continued)

OTHER PUBLICATIONS

International Search Report and Written Opinion dated Dec. 6, 2018, in related PCT Application No. PCT/US2018/048389.

*Primary Examiner* — Alexander Gilman
(74) *Attorney, Agent, or Firm* — Maschoff Brennan

(57) ABSTRACT

A module mount interposer may include one or more fastener receivers configured to mechanically couple with one or more fasteners so as to mechanically and electrically couple a module to the interposer. The module mount interposer may also include a core configured to electrically couple with the module, wherein each of the fastener receivers are mechanically coupled to the core. The module mount interposer may additionally include a solder layer electrically coupled to the core and configured to electrically couple with a printed circuit board (PCB) so as to provide an electrical signal from the module to the PCB and to provide an electrical signal from the PCB to the module.

20 Claims, 8 Drawing Sheets

(56) References Cited

U.S. PATENT DOCUMENTS

| | | | | |
|---|---|---|---|---|
| 6,354,844 B1 * | 3/2002 | Coico | H05K 3/325 | 439/260 |
| 6,358,063 B1 * | 3/2002 | Neidich | H01R 9/096 | 439/271 |
| 6,375,476 B1 * | 4/2002 | Goodwin | H01L 23/4093 | 439/71 |
| 6,460,170 B1 | 10/2002 | Shaeffer et al. | | |
| 6,527,563 B2 * | 3/2003 | Clayton | G01R 1/0466 | 257/E23.067 |
| 6,702,588 B1 * | 3/2004 | McHugh | H01R 12/7064 | 439/331 |
| 6,848,942 B1 * | 2/2005 | Regnier | H01R 4/028 | 439/587 |
| 6,929,484 B2 * | 8/2005 | Weiss | H01R 13/2414 | 439/66 |
| 7,518,235 B2 * | 4/2009 | Coico | H01L 23/4006 | 257/717 |
| 7,618,267 B2 * | 11/2009 | Konno | H01R 13/2414 | 439/91 |
| 8,018,738 B2 * | 9/2011 | Doblar | H05K 7/1061 | 174/260 |
| 8,270,180 B2 * | 9/2012 | Liu | H05K 1/0251 | 174/262 |
| 8,718,550 B2 * | 5/2014 | Zhao | H01L 23/552 | 257/532 |
| 9,093,767 B2 * | 7/2015 | Rathburn | H05K 3/326 | |
| 9,791,649 B2 * | 10/2017 | De Bruijn | G02B 6/4292 | |
| 2003/0000080 A1 * | 1/2003 | Colbert | H05K 7/1061 | 29/832 |
| 2004/0088121 A1 | 5/2004 | Colbert et al. | | |
| 2005/0007748 A1 | 1/2005 | Callahan et al. | | |
| 2006/0003608 A1 * | 1/2006 | Sandoval | H01R 9/096 | 439/74 |
| 2006/0040529 A1 * | 2/2006 | Kuo | H01R 4/64 | 439/82 |
| 2006/0202325 A1 | 9/2006 | Coico et al. | | |
| 2007/0134948 A1 | 6/2007 | Brodsky et al. | | |
| 2009/0325415 A1 | 12/2009 | Brist et al. | | |
| 2010/0297857 A1 * | 11/2010 | Ito | H01R 12/523 | 439/65 |

* cited by examiner

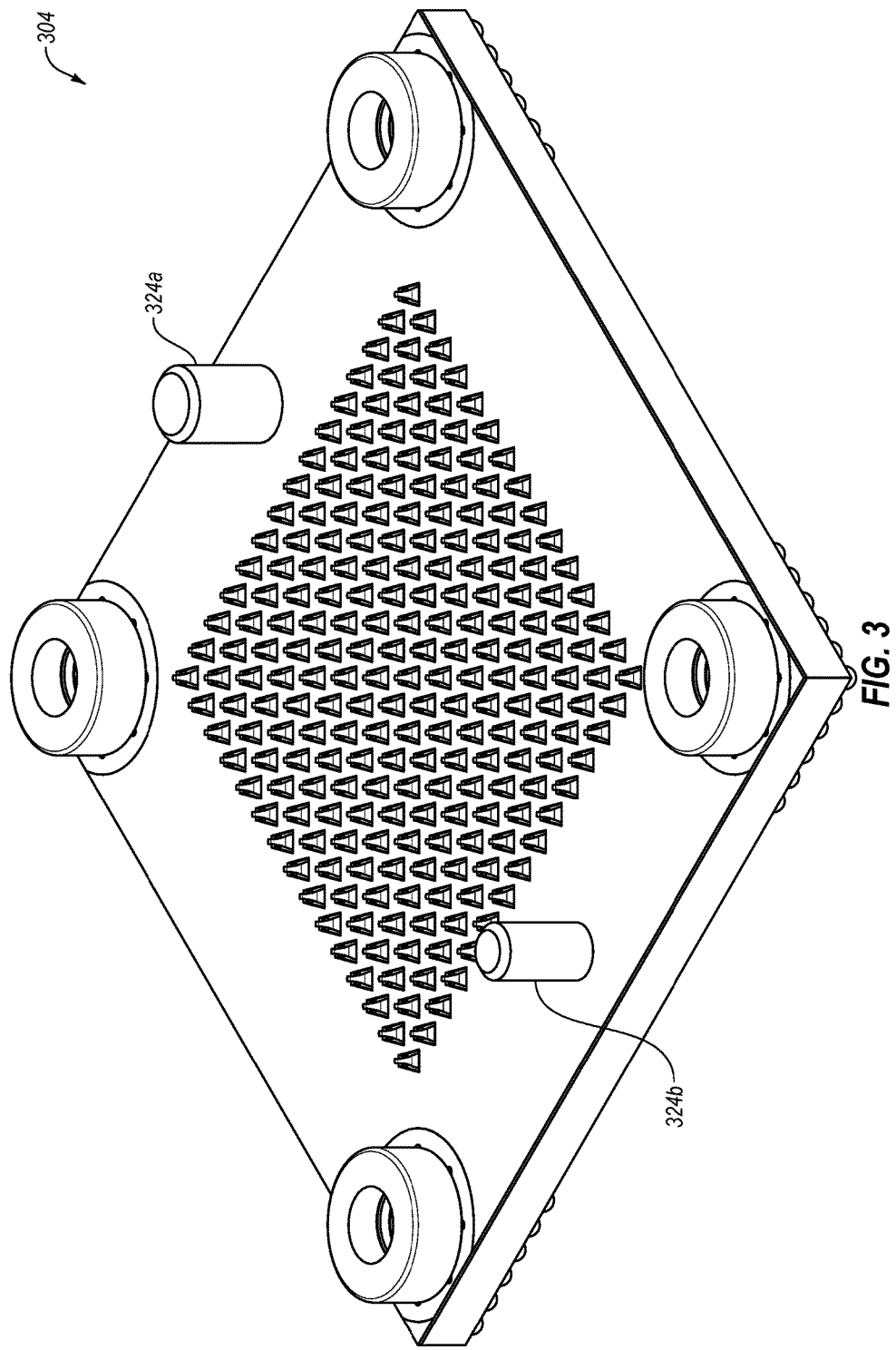

MODULE MOUNT INTERPOSER

FIELD

The embodiments discussed herein relate generally to communication modules. More particularly, example embodiments relate to module mount interposers for selectively engaging communication modules with a host device.

BACKGROUND

Communication modules, such as an optical transceiver module, are increasingly used in optoelectronic communication. Some communication modules may be mounted to a host device by soldering the communication module to the host device. A communication module typically communicates with a printed circuit board (PCB) of the host device by transmitting and/or receiving electrical signals to and/or from the host device PCB. These electrical signals can also be transmitted by or to the module outside the host device as optical and/or electrical signals.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

These and other limitations are overcome by embodiments of the invention which relate to systems and methods for engaging communication modules with a host device.

This Summary is provided to introduce a selection of concepts in a simplified form that are further described below in the Description of Embodiments. This Summary is not intended to identify key features or essential characteristics of the claimed subject matter, nor is it intended to be used as an aid in determining the scope of the claimed subject matter.

In an example embodiment, a module mount interposer may include one or more fastener receivers configured to mechanically couple with one or more fasteners so as to mechanically and electrically couple a module to the interposer. The module mount interposer may also include a core configured to electrically couple with the module, wherein each of the fastener receivers are mechanically coupled to the core. The module mount interposer may additionally include a solder layer electrically coupled to the core and configured to electrically couple with a printed circuit board (PCB) so as to provide an electrical signal from the module to the PCB and to provide an electrical signal from the PCB to the module.

In another example embodiment, a module mount frame may include one or more fastener receivers configured to mechanically couple with one or more fasteners so as to mechanically couple a module to the frame. The module mount frame may also include a medial board. The medial board may include a core configured to electrically couple with the module. The medial board may also include a solder layer electrically coupled to the core and configured to electrically couple with a PCB so as to provide an electrical signal from the module to the PCB and to provide an electrical signal from the PCB to the module.

In yet another example embodiment, a module includes a housing of a module defining a plurality of holes. The module may also include a module mount mechanism. The module mount mechanism may include one or more fasteners. The module mount mechanism may also include an interposer. The interposer may include one or more fastener receivers configured to mechanically couple with the one or more fasteners so as to mechanically couple the housing and electrically couple the module to the interposer. The interposer may also include a beam grid configured to electrically couple with the module when the module is mechanically and electrically coupled to the interposer. The interposer may additionally include a core electrically coupled to the beam grid, wherein the plurality of fastener receivers are mechanically coupled to the core. The interposer may include a solder layer electrically coupled to the core and configured to electrically couple with a PCB so as to provide an electrical signal from the module to the PCB and to provide an electrical signal from the PCB to the module.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are, therefore, not to be considered limiting of its scope. The invention will be described and explained with additional specificity and detail through the use of the accompanying drawings in which:

FIG. 3 is a top perspective view of an interposer including alignment pins;

DESCRIPTION OF EMBODIMENTS

Figure 1A:
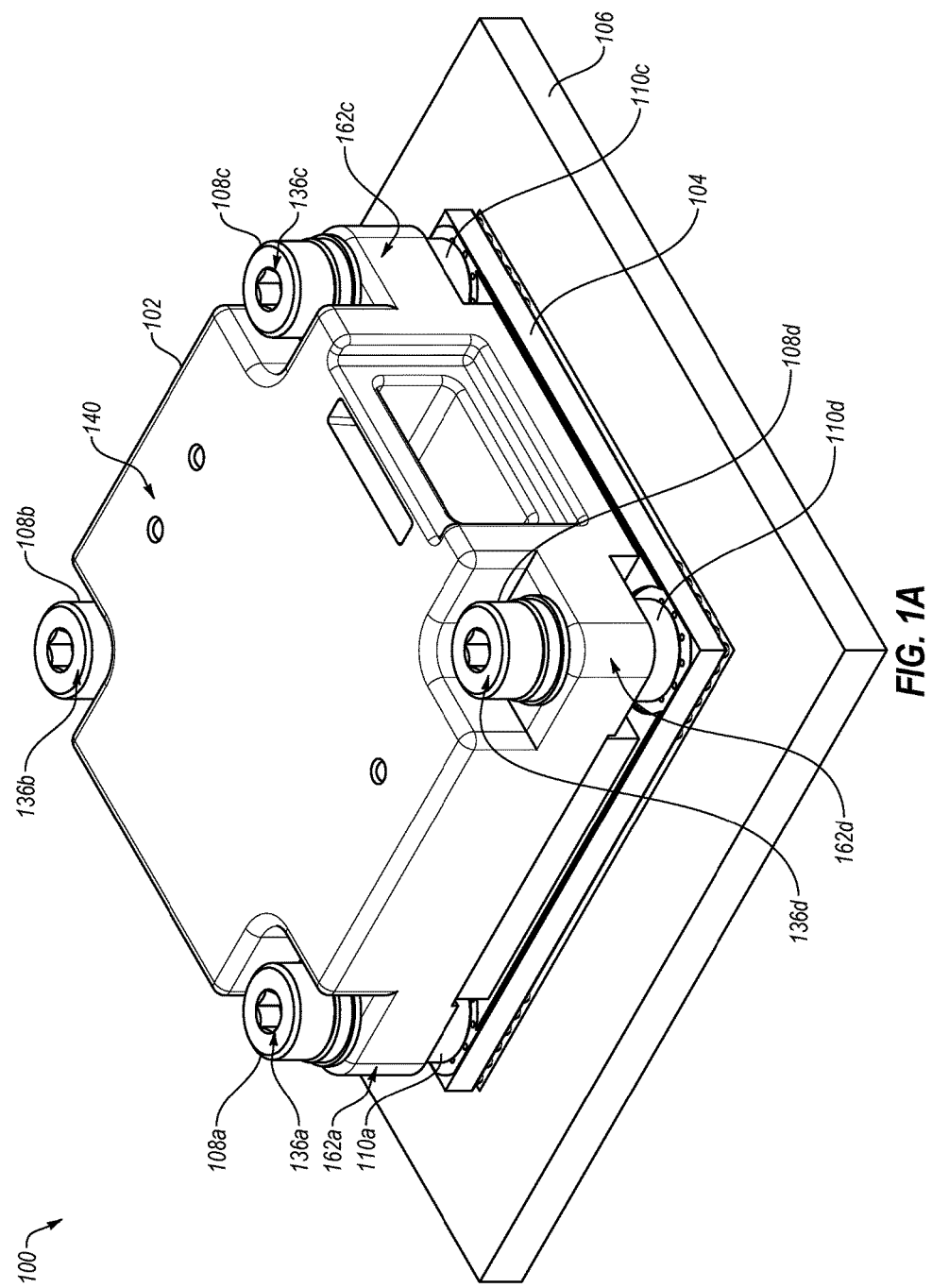
FIG. 1A is a top perspective view of a board mount assembly.

Some communication modules may be configured to mount to a host device, such as a printed circuit board (PCB), through a mounting interposer. Mounting interposers may be used to physically connect the communication module to the PCB so as to electrically couple the communication module to the PCB. Mounting interposers may be used to make mounting and unmounting the communication module from the PCB quicker and simpler Example embodiments may relate to module mount interposers for engaging board mount modules with a PCB. Example embodiments may also relate to module mount frames that include medial boards for engaging the board mount module with the PCB. Embodiments described herein may include fewer and/or less complex parts, and may permit simplified assembly compared to traditional module mount mechanisms. In addition, embodiments of the module mount interposer and/or module mount frame described herein may eliminate the need for complex clamping mechanisms and pre-mounted nuts on the PCB, which may reduce the amount of time required for replacing a board mount module compared to the module mount mechanisms that include complex clamping mechanisms and pre-mounted nuts on the PCB. For at least these reasons, embodiments of the module mount interposer and/or module mount frame may be more efficient to implement than traditional module mount mechanisms.

Furthermore, compared to traditional module mount mechanisms, embodiments of the module mount interposer and/or module mount frame described herein may reliably couple, both mechanically and electrically, the board mount module to the PCB so as to provide and/or receive electrical signals to or from the board mount module and to or from the PCB. Some embodiments of the module mount interposer and/or module mount frame may further include one or more alignment pins configured to align the board mount module with the module mount interposer and/or module mount frame so as to improve mechanical and electrical coupling to the module mount interposer and/or module mount frame.

Reference will now be made to the drawings wherein like structures will be provided with like reference designations. It should be understood that the drawings are diagrammatic and schematic representations of example embodiments and, accordingly, are not limiting of the scope of the present invention, nor are the drawings necessarily drawn to scale. It should also be understood that many of the features of the disclosed embodiments may be substantially symmetrical and a pluralized reference to a feature may refer to a pair of similar features of which only one may be labeled in the drawings.

Figure 1B:
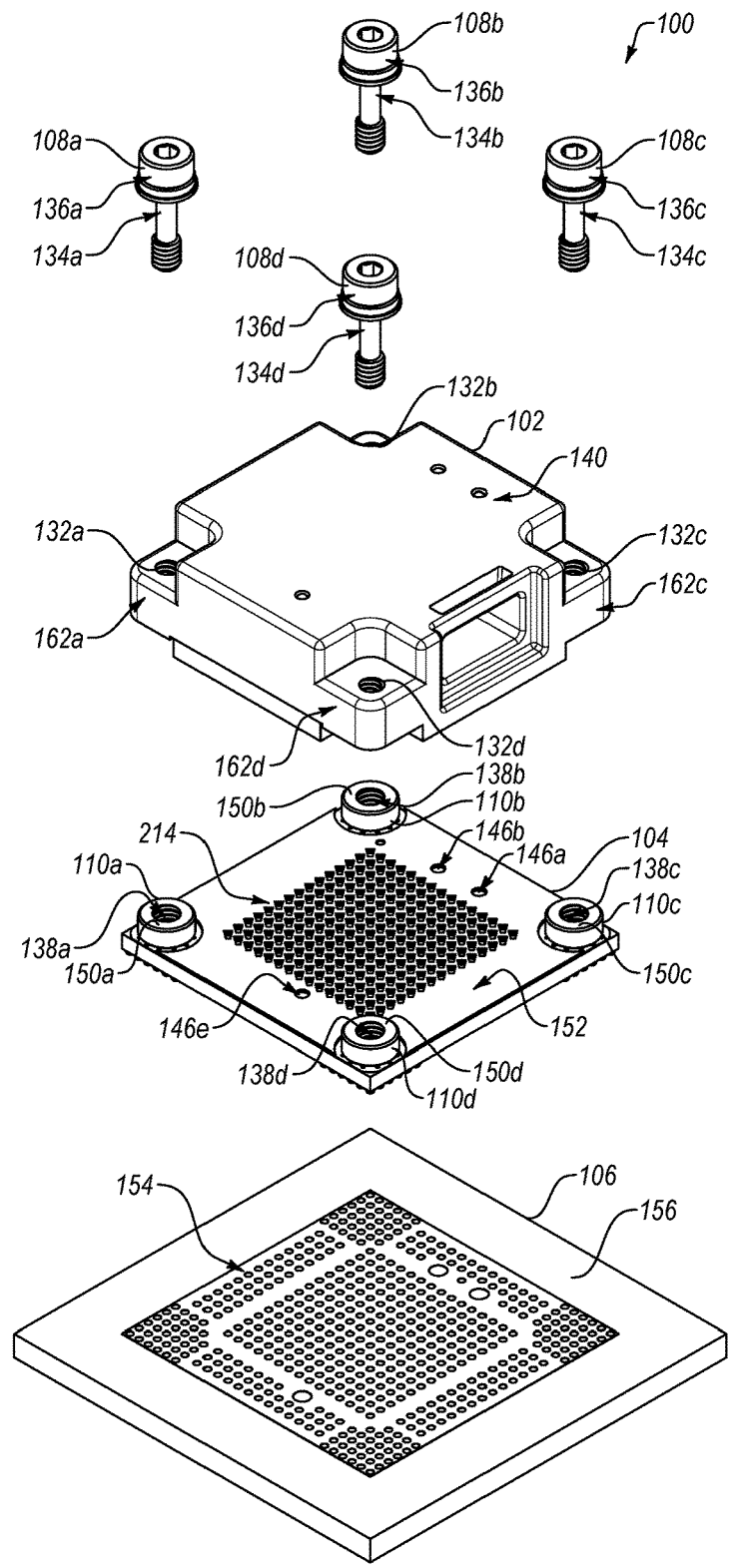
FIG. 1B is an exploded top perspective view of the board mount assembly.
Figure 1C:
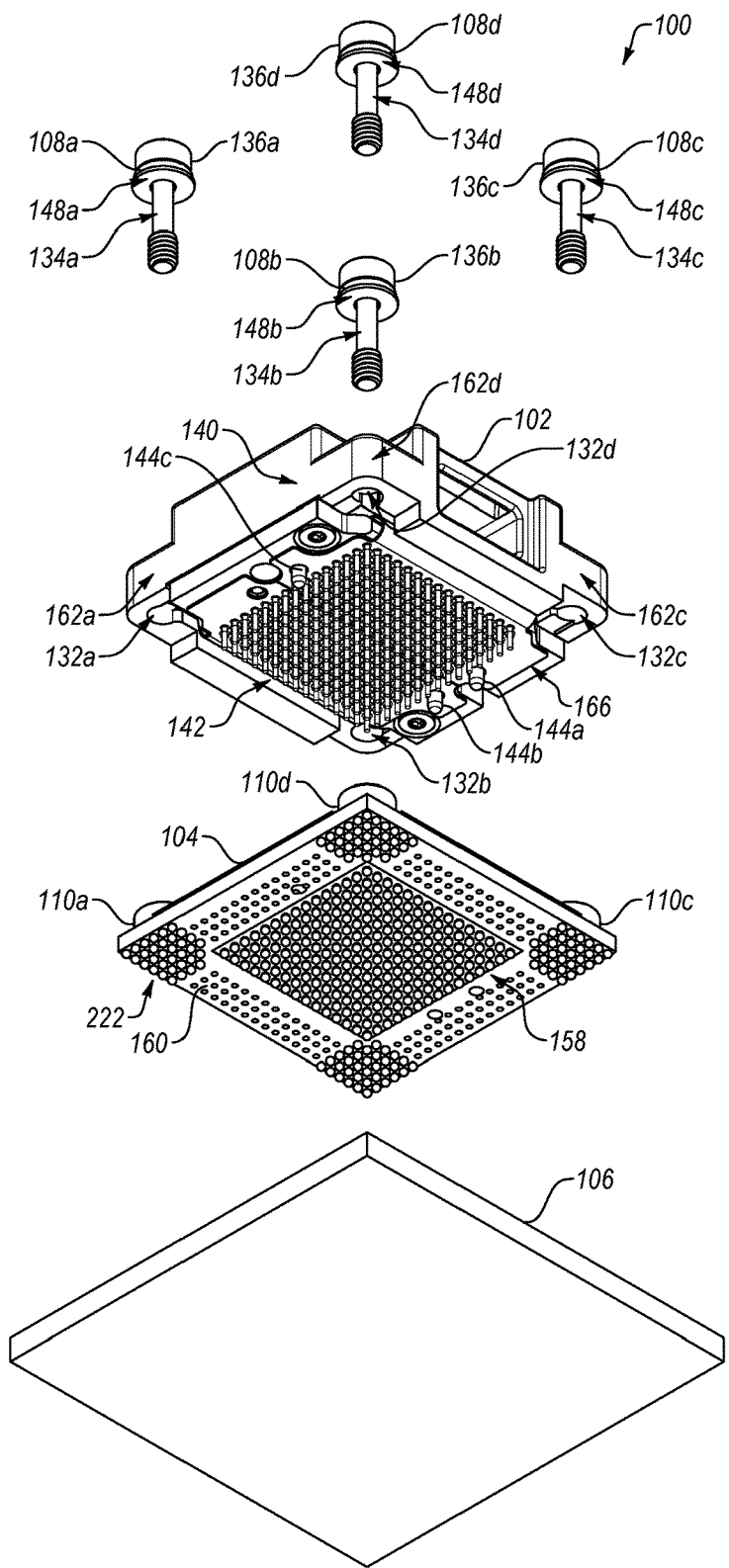
FIG. 1C is an exploded bottom perspective view of the board mount assembly.

FIGS. 1A, 1B, and 1C are, respectively, top perspective, exploded top perspective, and exploded bottom perspective views of a board mount assembly (BMA) 100 including a module mount interposer (herein interposer) 104 for engaging a board mount module (herein module) 102 with a PCB 106. With combined reference to FIGS. 1A-1C, the BMA 100 may be employed in transmitting and/or receiving communication signals and in the conversion of optical signals to and from electrical signals.

The BMA 100 may also include at least one of bolt 108a, bolt 108b, bolt 108c, and/or bolt 108d (collectively 'bolts 108'). Additionally, the BMA may include at least one of nut 110a, nut 110b, nut 110c, and/or nut 110d (collectively 'nuts 110'). The bolts 108 and the nuts 110 may be employed for mechanically coupling the module 102 with the interposer 104. The nuts 110 may be mounted on a core, which is discussed in more detail below, of the interposer 104. The module 102 may include a housing 140 which defines at least one of bolt hole 132a, bolt hole 132b, bolt hole 132c, and/or bolt hole 132d (collectively 'bolt holes 132'). Each of the bolt holes 132 defined by the housing 140 may be positioned so as to be aligned with a corresponding one of the nuts 110 on the interposer 104. Each of the bolt holes 132 defined by the housing 140 may be configured to permit a corresponding one of the bolts 108 to pass through and couple with a corresponding one of the nuts 110 on the interposer 104.

One or more of the bolts 108 may include a head portion 136a-d and a body portion 134a-d (shown, e.g., in FIGS. 1B and 1C). A length of the bolts 108 may be determined based on the housing 140 of the module 102 so as to couple, both mechanically and electrically, the module 102 with the interposer 104. An external diameter of the body portion 134a-d of the bolts 108 may be sized to fit within an internal diameter of the bolt holes 132. Likewise, the body portion 134a-d of each of the bolts 108 may include a threaded portion configured to engage with threads of an internal cavity 138a-d of the corresponding one of the nuts 110. The head portion 136a-d of each of the bolts 108 may be oversized in comparison to the internal diameter of the bolt holes 132 defined by the housing 140. When the bolts 108 are engaged with the nuts 110 (shown, e.g., in FIG. 1A), the head portion 136a-d of each of the bolts 108 may urge the module 102 towards the interposer 104.

The module 102 may include multiple module electrical connections 142 on a bottom portion of the module 102 (shown, e.g., in FIG. 1C). Likewise, the interposer 104 may include a beam grid 214 (shown, e.g., in FIG. 1B), which is discussed in more detail below, with multiple beam grid electrical connections 164. The module electrical connections 142 and the beam grid electrical connections 164 may be arranged in the same or similar configuration. When the bolts 108 are engaged with the nuts 110, each of the module electrical connections 142 may be electrically coupled to a corresponding beam grid electrical connection 164.

Furthermore, the module 102 may include at least one of alignment pin 144a, alignment pin 144b, and/or alignment pin 144c (collectively 'alignment pins 144'). The module 102 may include the alignment pins 144 on a bottom surface 166 of the module 102. The alignment pins 144 may be employed to align the module 102 with the interposer 104. Different portions of the bottom surface 166 of the module 102 may include different numbers of alignment pins 144. For example, a back portion of the bottom surface 166 of the module 102 may include two alignment pins 144 (alignment pin 144a and alignment pin 144b) and a front portion of the bottom surface 166 of the module 102 may include one of the alignment pins 144 (alignment pin 144c). The interposer 104 may define at least one of alignment hole 146a, alignment hole 146b, and/or alignment hole 146c (collectively 'alignment holes 146'). The alignments holes 146 may be defined such that they are similarly sized, shaped, and positioned as the alignment pins 144 on the module 102. The alignment pins 144 may be used to discourage improper coupling of the module 102 with the interposer 104.

Additionally, when the bolts 108 are engaged with the nuts 110, a portion 162a-d of the housing 140 of the module 102 may be positioned between the head portion 136a-d of the bolts 108 and a top surface 150a-d of the nuts 110. When the bolts 108 are engaged with the nuts 110, the housing 140 of the module 102 may be in direct contact with at least one of a bottom surface 148a-d of the head portion 136a-d of the bolts 108 (shown, e.g., in FIG. 1C), the top surface 150a-d of the nuts 110 (shown, e.g., in FIG. 1B), and/or a portion of a top surface 152 of the interposer 104 (shown, e.g., in FIG. 1B). The contact between the module 102 and at least one of the bottom surface 148a-d of the head portion 136a-d of the bolts 108, the top surface 150a-d of the nuts 110, and/or portion of the top surface 152 of the interposer 104 may provide structural stability to the module 102 while coupled with the interposer 104. The provided structural stability of the module 102 may ensure that each of the module electrical connections 142 are electrically coupled securely to the corresponding beam grid electrical connection 164.

The PCB 106 may include multiple PCB electrical connections 154 on a top surface 156 of the PCB 106 (shown, e.g., in FIG. 1B). Likewise, the interposer 104 may include a solder layer 222 (shown, e.g., in FIG. 1C), which is discussed in more detail below, on a bottom surface 160 of the interposer 104 (shown, e.g., in FIG. 1C). The solder layer 222 may include multiple solder layer electrical connections 158. The PCB electrical connections 154 and the solder layer electrical connections 158 may be arranged in the same or similar configuration. The solder layer 222 may be employed for mechanically and electrically coupling the interposer 104 with the PCB 106. The solder layer 222 of the interposer 104 may couple with the PCB 106 through surface mount technologies (SMT). For example, the interposer 104 may couple with the PCB 106 through soldering, through hole, or any other suitable surface mount technique. When the interposer 104 is coupled with the PCB 106, each of the PCB electrical connections 154 may be electrically coupled with a corresponding solder layer electrical connection 158.

Furthermore, electrically coupling the module 102 with the interposer 104 and electrically coupling the interposer 104 with the PCB 106 may permit an electrical signal generated by the module 102 to be received by the PCB 106 through the interposer 104. Likewise, electrically coupling the module 102 with the interposer 104 and electrically coupling the interposer 104 with the PCB 106 may permit an electrical signal provided by the PCB 106 to be received by the module 102 through the interposer 104.

The module 102 may electrically and/or optically couple with other components. For example, the module 102 may receive an optical signal via a fiber optic cable and may convert the optical signal to an electrical signal. In these embodiments, the module 102 may provide the electrical signal to the interposer 104 through the multiple module electrical connections 142. Additionally or alternatively, the module 102 may receive an electrical signal and may manipulate the electrical signal. The module 102 may provide the manipulated electrical signal to the interposer 104 through the multiple module electrical connections 142. Alternately or additionally, the module 102 may convert the electrical signal to an optical signal and may transmit the optical signal via a fiber optic cable. Likewise, the module 102 may receive an electrical signal from the PCB 106 via the interposer 104.

The various module electrical connections 142 may provide the same portion or different portions of the electrical signal generated by the module 102. For example, a first portion of the module electrical connections 142 may provide a data portion of the electrical signal generated by the module 102, while a second portion of the module electrical connections 142 may provide a control portion of the electrical signal generated by the module 102. As another example, a first portion of the module electrical connections 142 may provide a data portion of the electrical signal generated by the module 102, while a second portion of the module electrical connections 142 may provide a control portion of the electrical signal generated by the module 102, and a third portion of the module electrical connections 142 may provide grounding of the module 102 to the interposer 104.

Additionally, the various module electrical connections 142 may receive the same portion or different portions of an electrical signal provided by the PCB 106 through the interposer 104. For example, a first portion of the module electrical connections 142 may receive a data portion of the electrical signal provided by the PCB 106, while a second portion of the module electrical connections 142 may receive a control portion of the electrical signal provided by the PCB 106. As another example, a first portion of the module electrical connections 142 may receive a data portion of the electrical signal provided by the PCB 106, while a second portion of the module electrical connections 142 may receive a control portion of the electrical signal provided by the PCB 106, and a third portion of the module electrical connections 142 may provide grounding of the module 102 to the PCB 106 through the interposer 104.

The interposer 104 may include multiple layers and electrical components, which are discussed in more detail below, configured to receive the electrical signal from the module 102 and/or the PCB 106 and provide the electrical signal to the PCB 106 and/or the module 102. The interposer 104 may be sized and shaped so as to, both mechanically and electrically, couple with the module 102 and/or the PCB 106. For example, the interposer 104 may be shaped as a square, rectangle, circle, or any other suitable shape for coupling with the module 102 and/or the PCB 106.

The PCB 106 may also include multiple layers configured to receive the electrical signal from the interposer 104, provide the electrical signal to the interposer 104, manipulate the electrical signal, and/or provide the electrical signal to other components located on or external to the PCB 106. The PCB 106 may include a ground plane so as to provide grounding of the PCB 106 and/or of the various components electrically coupled to the PCB 106.

The nuts 110 may be positioned on the interposer 104 so as to evenly distribute pressure applied to the module 102 by the bolts 108 and applied by the module 102 to the interposer 104. For example, the nuts 110 may be positioned to receive the bolts 108 near and/or along an external edge of the module 102. For example, the interposer 104 may be shaped as a square and the nuts 110 may each be positioned at a different corner of the interposer 104. The nuts 110 may include SMT nuts.

Mechanically coupling the module 102 to the interposer 104 through the use of the nuts 110 mounted to the interposer 104 and the bolts 108 that pass through the bolt holes 132 defined by the housing 140 of the module 102 may reduce an amount of time needed to remove and install the module 102 within the BMA 100. Similarly, reducing the amount of time needed to remove and install the module 102 may ease in debugging, updating, and/or performing general maintenance of the BMA 100. Also, electrically coupling the module 102 to the interposer 104 instead of the PCB 106, may reduce wear of the electrical connections on the PCB 106, which may extend a lifetime of the PCB 106.

Figure 2A:
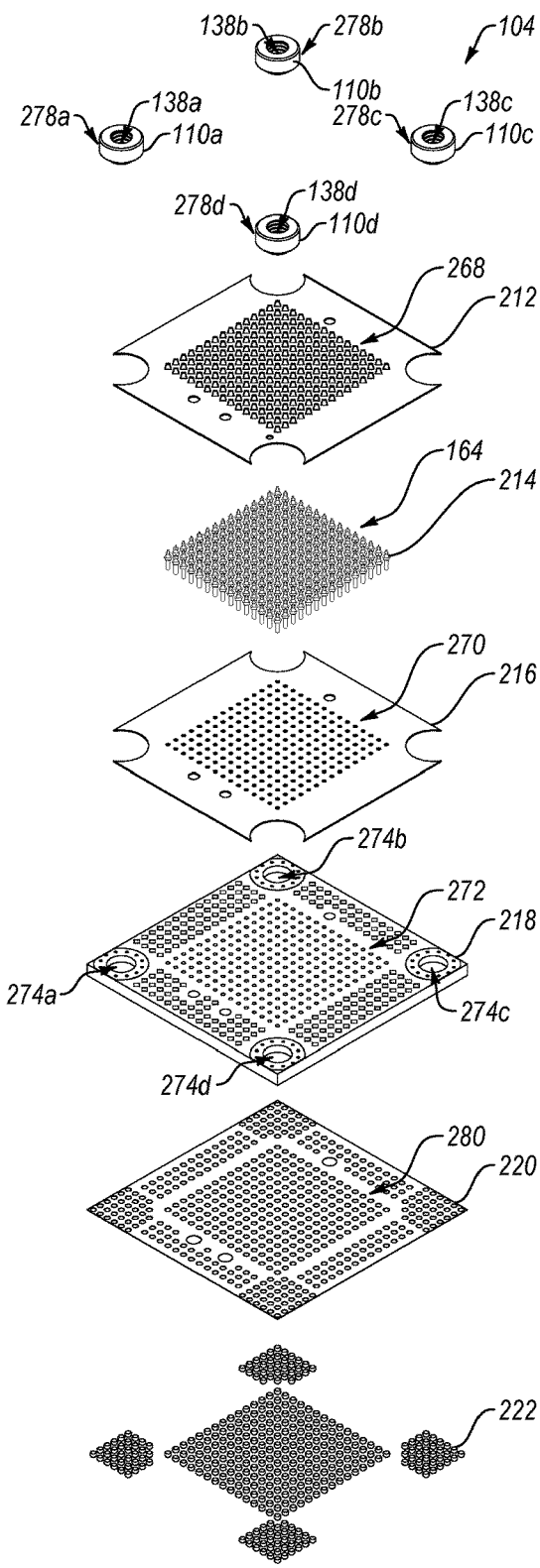
FIG. 2A is an exploded top perspective view of an interposer of FIGS. 1A-1C.
Figure 2B:
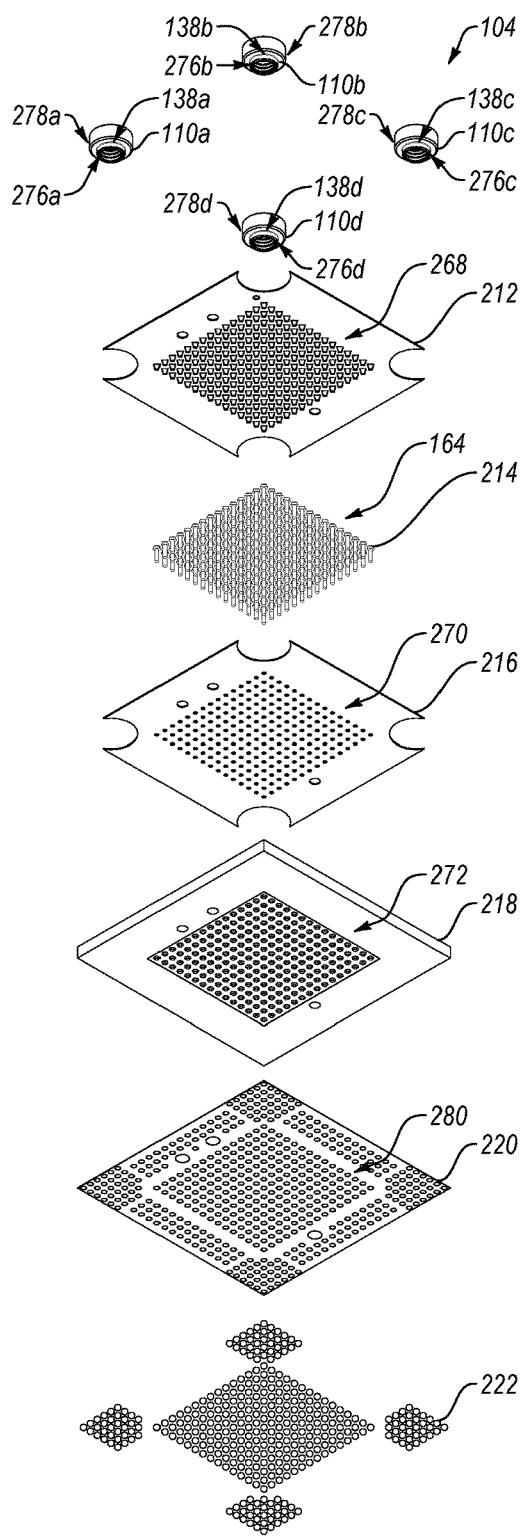
FIG. 2B is a bottom exploded perspective view of the interposer.

FIGS. 2A and 2B are, respectively, exploded top perspective and exploded bottom perspective views of the interposer 104 of FIGS. 1A-1C. The interposer 104 may be the same or similar to the interposer 104 discussed above in relation to FIGS. 1A-1C.

The interposer 104 may include a coverlay 212; a beam grid 214; a bondply 216; a core 218; one or more of the nuts 110; a solder mask 220; and a solder layer 222. The various components of the interposer 104 may be configured to receive the electrical signal generated by the module 102 of FIGS. 1A-1C, receive the electrical signal provided by PCB 106 of FIGS. 1A-1C, isolate the electrical signals to reduce and/or eliminate interference/cross-talk, and/or provide the electrical signals to the PCB 106 or the module 102 of FIGS. 1A-1C.

The coverlay 212 may be located on the top portion of the interposer 104 and may define an array of coverlay holes 268. Each of the coverlay holes 268 may be configured to permit a corresponding beam grid electrical connection 164 to pass through the coverlay 212. The coverlay 212 may isolate the beam grid electrical connections 164 from each other so as to reduce interference and/or cross-talk experienced by the various beam grid electrical connections 164. Likewise, the coverlay 212 may be employed to seal and/or cover the bondply 216 from external elements to reduce performance degradation of the interposer 104. For example, the coverlay 212 may reduce oxidation of components of the interposer 104. Additionally, the coverlay 212 may be employed as a solder resist so as to reduce electrical coupling of various components of the interposer 104.

Additionally, the bondply 216 may be located between the coverlay 212 and the core 218. The bondply 216 may be a thin film adhesive employed to adhere the coverlay 212 to the core 218. The bondply 216 may define an array of bondply holes 270 configured to permit a corresponding beam grid electrical connection 164 to pass through the bondply 216. Additionally, the bondply 216 may isolate the beam grid electrical connections 164 from each other so as to reduce interference and/or cross talk experienced by the various beam grid electrical connections 164.

The core 218 may be employed to provide structure and/or stability of the various components of the interposer 104. For example, the core 218 may provide structure for the coverlay 212, the bondply 216, and/or the solder mask 220. Additionally, the core 218 may isolate components located on the top portion of the interposer 104 from components located on a bottom portion of the interposer 104. Likewise, the core 218 may include thermally conductive material configured to receive heat generated by the electrical signal within the interposer 104 and spread the heat throughout the core 218 so as to reduce thermal failures of the interposer 104. The thermally conductive material of the core 218 may include copper, aluminum, or any other appropriate thermally conductive material.

Furthermore, the core 218 may define an array of core holes 272 configured to permit a corresponding beam grid electrical connection 164 to pass through the core 218. Each of the core holes 272 may include an insulator layer that electrically isolates the corresponding beam grid electrical connection 164 from the core 218. Each insulator layer may discourage the corresponding beam grid electrical connection 164 from being electrically coupled with the core 218. Additionally or alternatively, each insulator layer may include a thermally conductive material configured to thermally couple the corresponding beam grid electrical connection 164 to the core 218 so as to transfer heat from the corresponding beam grid electrical connection 164 to the core 218.

Likewise, the core 218 may define at least one of nut receiver hole 274a, nut receiver hole 274b, nut receiver hole 274c, and/or nut receiver hole 274d (collectively 'nut receiver holes 274'). The nut receiver holes 274 may be configured to connect a corresponding one of the nuts 110 to the core 218. The nut receiver holes 274 may be sized so as to permit a bottom portion 276a-d (shown, e.g., in FIG. 2B) of the corresponding one of the nuts 110 to couple with the core 218. For example, an internal diameter of the nut receiver holes 274 may be the same or similar size as an external diameter of the bottom portion 276a-d of the corresponding one of the nuts 110 so as to securely couple the corresponding one of the nuts 110 with the core 218.

Likewise, each of the nut receiver holes 274 may include a solder pad for mounting the nuts 110 to the core 218. The solder pads may be shaped and/or sized to correspond to an external surface of the bottom portion 276a-d of the nuts 110. Additionally, the solder pads may be circular in shape and may extend beyond the nut receiver holes 274. For example, the size and/or shape of the solder pads may correspond to a bottom surface of a top portion 278a-d of the nuts 110. The solder pads may also ground the nuts 110 to the core 218 so as to discourage a difference in electric charge building up between the nuts 110 and the core 218.

Additionally, the nuts 110 may mount to the core 218 through surface mount technology. For example, the nuts 110 may be mounted to the core 218 through soldering. To increase a surface area of the nuts 110 that mechanically couple with the core 218, the top portion 278a-d of the nuts 110 may be oversized compared to the nut receiver holes 274 defined by the core 218. Increased mechanical coupling of the nuts 110 with the core 218 may increase a structural stability of the mechanical coupling of the module 102 with the interposer 104. Likewise, an internal cavity 138a-d of the nuts 110 may include threads that are configured to couple with the threaded portion of the bolts 108.

The solder mask 220 may be located on the bottom portion of the interposer 104 and may define an array of solder mask holes 280. Each of the solder mask holes 280 may be configured to permit a corresponding beam grid electrical connection 164 to pass through the solder mask 220. The solder mask 220 may isolate the beam grid electrical connections 164 from each other so as to reduce interference and/or cross-talk experienced by the various beam grid electrical connections 164. Likewise, the solder mask 220 may be employed to seal and/or cover the core 218 from external elements to reduce performance degradation of the interposer 104. Likewise, the solder mask 220 may be employed as a solder resist so as to discourage electrical coupling of various components of the interposer 104.

The beam grid electrical connections 164 may be arranged in a grid array and may be configured to electrically couple with the module 102 and the solder layer 222. The various beam grid electrical connections 164 may receive the electrical signal from the module 102 and may provide the electrical signal to the solder layer 222. Likewise, the various beam grid electrical connections 164 may receive the electrical signal from the solder layer 222 and may provide the electrical signal to the module 102. Each of the beam grid electrical connections 164 may be sized and shaped so as to discourage the beam grid electrical connections 164 from being pushed all the way through the interposer 104.

FIG. 3 is a perspective view of an interposer 304 that includes at least one of a first alignment pin 324a and/or a second alignment pin 324b (collectively "alignment pins 324'). The interposer 304 may be structurally similar to the interposer 104 of FIGS. 1A-2B. The alignment pins 324 may be located near and/or along an outside edge of the interposer 304. The alignment pins 324 may be employed to align the module 102 with the interposer 304. The first alignment pin 324a may be sized differently than the second alignment pin 324b. For example, an external diameter of the first alignment pin 324a may be smaller than an external diameter of the second alignment pin 324b. The interposer 304 may be used in the BMA 100 of FIGS. 1A-1C in place of the interposer 104 without alignment pins.

The housing 140 of the module 102 may define corresponding alignment holes that are similarly sized and/or shaped as the alignment pins 324. For example, a first alignment hole defined by the housing 140 of the module 102 may include an internal diameter that is the same or similar diameter to the external diameter of the first alignment pin 324*a*. Likewise, an internal diameter of a second alignment hole defined by the housing 140 of the module 102 may be the same or similar diameter of the external diameter of the second alignment pin 224*b*. Additionally, the internal diameter of the first alignment hole may be sized differently than the internal diameter of the second alignment hole. The alignment pins 324 may be used to discourage improper coupling of the module 102 with the interposer 304.

Figure 4A:
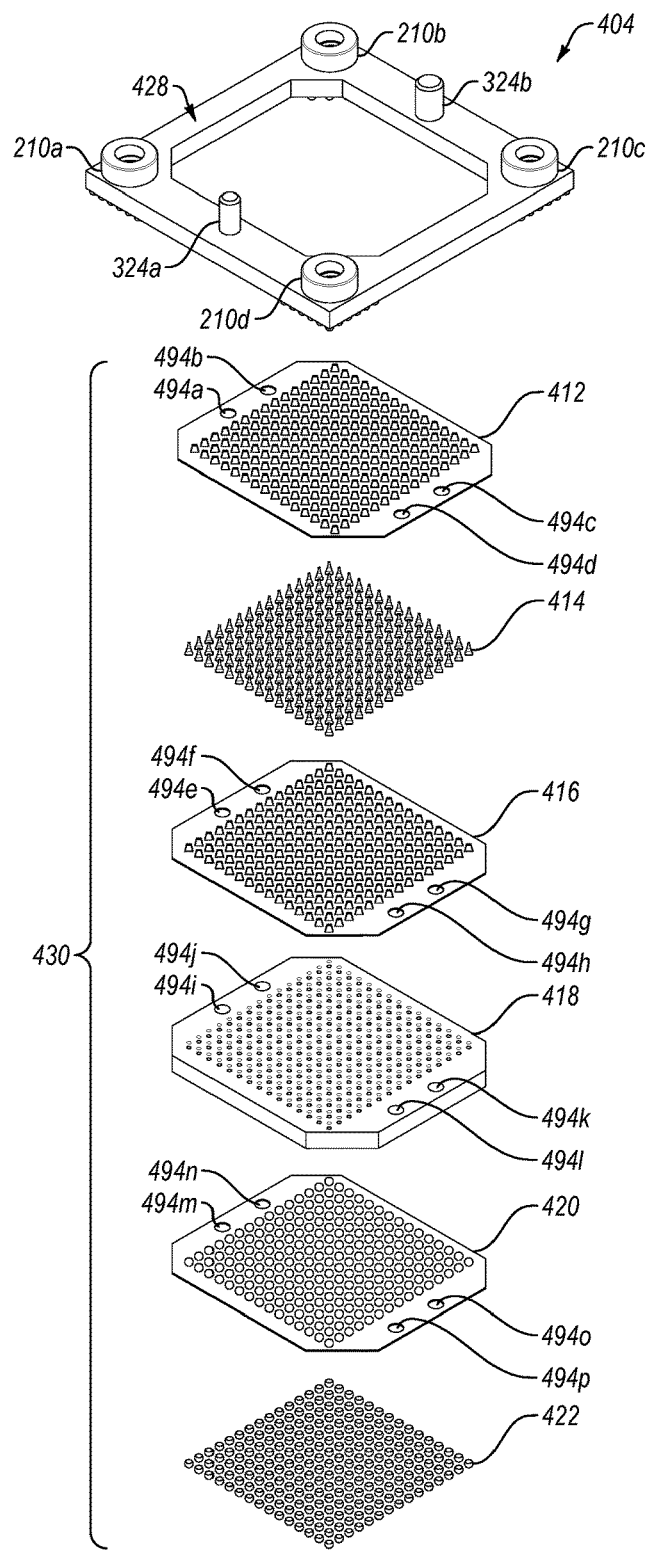
FIG. 4A is an exploded top perspective view of a module mount frame system.
Figure 4B:
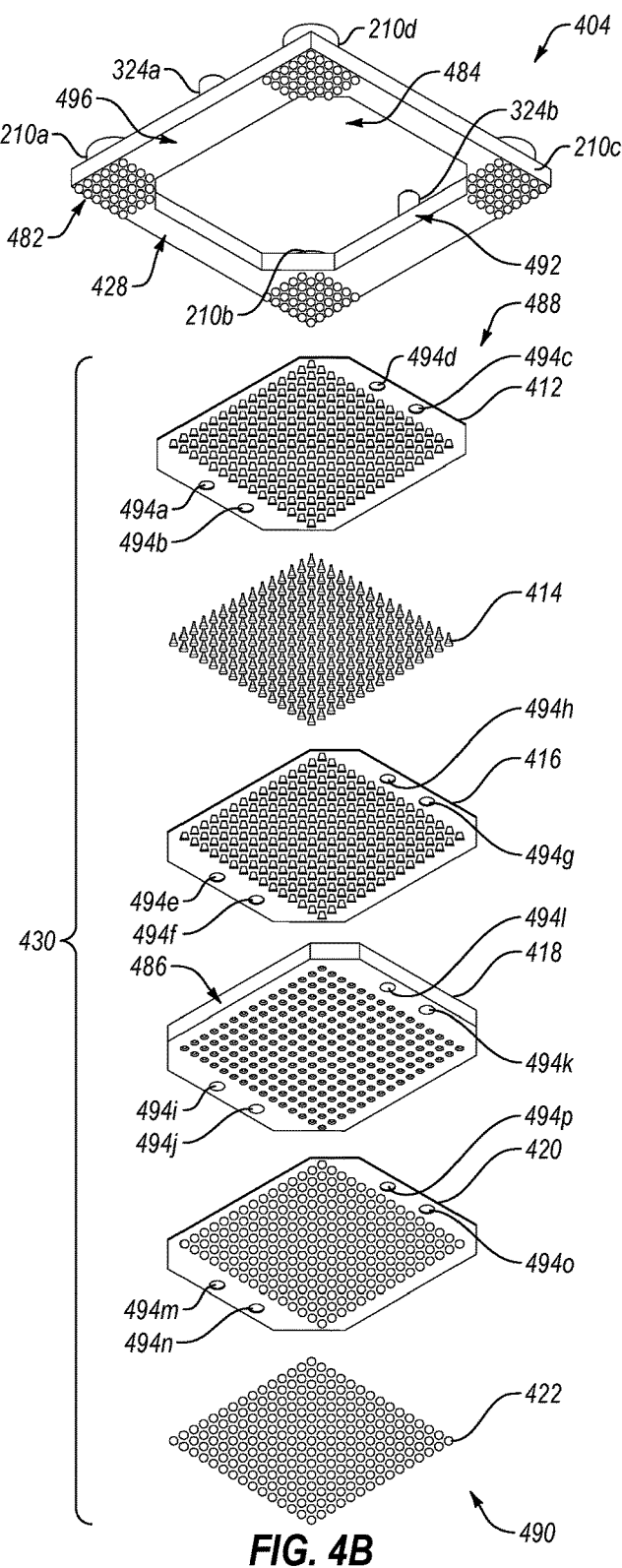
FIG. 4B is a bottom perspective view of the module mount frame system.

FIGS. 4A and 4B are, respectively, exploded top perspective and exploded bottom perspective views of a module mount frame system 404. The module mount frame system 404 may include a mount frame (herein frame) 428 and a medial board 430. The module mount frame system 404 may be used in the BMA 100 of FIGS. 1A-1C in place of the interposer 104 without the frame 428. The module mount frame system 404 may be employed to mechanically and/or electrically couple with the module 102 and the PCB 106 of FIGS. 1A-1C. For example, the frame 428 may mechanically couple the module 102 to the module mount frame system 404. Likewise, the frame 428 may mechanically couple with the PCB 106. Additionally, the medial board 430 may be employed to electrically couple the module 102 to the PCB 106. The medial board 430 may receive the electrical signal generated by the module 102, isolate the electrical signal to reduce and/or eliminate interference/cross-talk, and/or provide the electrical signal to the PCB 106. Likewise, the medial board 430 may receive the electrical signal provided by the PCB 106, isolate the electrical signal to reduce and/or eliminate interference/cross-talk, and/or provide the electrical signal to the module 102.

The frame 428 may include PCB materials similar to the PCB 106. In the embodiment in which the frame 428 includes PCB materials, the frame 428 may define one or more nut receiver holes and the nuts 110 may mount to the frame 428 through surface mount technology similar to the nuts 110 in FIGS. 1A-2C. Additionally or alternatively, the frame 428 may include plastic and may be formed as a single piece of material. In the embodiment in which the frame 428 includes plastic, the nuts 110 may be formed into the frame 428 so as to mechanically couple the nuts 110 with the frame 428. In some embodiments, the frame 428 may include metal and may be formed as a single piece of material. In the embodiment in which the frame 428 includes metal, the nuts 110 may be formed into the frame 428 so as to mechanically couple the nuts 110 with the frame 428.

Similarly, the frame 428 may include at least one of a first alignment pin 224*a* and/or a second alignment pin 224*b* (collectively 'alignment pins 224'). The alignment pins 224 may be employed to align the module 102 with the frame 428 and/or the medial board 430. The first alignment pin 224*a* may be sized differently than the second alignment pin 224*b*. For example, an external diameter of the first alignment pin 224*a* may be smaller than an external diameter of the second alignment pin 224*b*.

The housing 140 of the module 102 may define corresponding alignment holes that are similarly sized and shaped as the alignment pins 224. For example, a first alignment hole defined by the housing 140 of the module 102 may include an internal diameter that is the same or similar diameter to the external diameter of the first alignment pin 224*a*. Likewise, an internal diameter of a second alignment hole defined by the housing 140 of the module 102 may be the same or similar diameter of the external diameter of the second alignment pin 224*b*. Additionally, the internal diameter of the first alignment hole may be sized differently than the internal diameter of the second alignment hole. The alignment pins 224 may be used to discourage improper coupling of the module 102 with the frame 428. Additionally, the frame 428 may include solder balls 482 on a bottom surface of the frame 428 (shown, e.g., in FIG. 4B). The solder balls 482 may be employed to mechanically couple the frame 428 with the PCB 106. The solder balls 482 may be located on a bottom surface 496 of the frame 428. In some embodiments, the solder balls 482 may be located at corners of the frame 428. Additionally or alternatively, the solder balls 482 may be located near and/or along an outside edge between the corners of the frame 428. In some embodiments, the solder balls 482 may substantially cover the bottom surface 496 of the frame 428.

Furthermore, the frame 428 may define an internal opening 484 configured to permit the medial board 430 to fit within the internal opening 484 of the frame 428. When mounted on the PCB 106, the frame 428 may substantially surround the medial board 430 around an edge of the medial board 430 without substantially covering a top surface 488 or a bottom surface 490 of the medial board 430. The medial board 430 may be sized and/or shaped so as to securely fit within the internal opening 484 of the frame 428. Additionally or alternatively, the frame 428 and the medial board 430 may be in contact at the edge 486 of the medial board 430. For example, the edge 486 of the medial board 430 may be in contact with an inside edge 492 of the internal opening 484 of the frame 428. The medial board 430 may be shaped and/or sized so that the frame 428 aligns the module electrical connections 142 and the electrical connections on the medial board 430. Having the frame 428 and the medial board 430 be separate components may increase a tolerance level of planarity variation within the BMA 100.

The medial board 430 may include various layers similar to the interposer 104, 204, and 304 discussed above in relation to FIGS. 2A-3. For example, the medial board 430 may include a coverlay 412, a beam grid 414, a bondply 416, a core 418, a solder mask 420, and a solder layer 422. The coverlay 412 may be the same or similar to the coverlay 212 discussed above in relation to FIGS. 2A-2B. Likewise, the beam grid 414 may be the same or similar to the beam grid 214 discussed above in relation to FIGS. 2A-2B. Additionally, the bondply 416 may be the same or similar to the bondply 216 discussed above in relation to FIGS. 2A-2B. The core 418 may be the same or similar to the core 218 discussed above in relation to FIGS. 2A-2B. Likewise, the solder mask 420 may be the same or similar to the solder mask 220 discussed above in relation to FIGS. 2A-2B. Additionally, the solder layer 422 may be the same or similar to the solder layer 222 discussed above in relation to FIGS. 2A-2B.

Various layers of the medial board 430 may define alignment board hole 494*a*, alignment board hole 494*b*, alignment board hole 494*c*, alignment board hole 494*d*, alignment board hole 494*e*, alignment board hole 494*f*, alignment board hole 494*g*, alignment board hole 494*h*, alignment board hole 494*i*, alignment board hole 494*j*, alignment board hole 494*k*, alignment board hole 494*l*, alignment board hole 494*m*, alignment board hole 494*n*, alignment board hole 494*o*, and/or alignment board hole 494*p* (collectively 'alignment board holes 494').

The alignment board holes 494 may be defined such that they are similarly sized, shaped, and positioned as corresponding alignment pins on the module 102. The alignment board holes 494 may be the same or similar to the alignment holes 146 discussed above in relation to FIGS. 1A-1C. Likewise, the corresponding alignment pins on the module 102 may be the same or similar to the alignment pins 144 discussed above in relation to FIGS. 1A-1C. The corresponding alignment pins on the module 102 and the alignment board holes 494 may be used to discourage improper coupling of the module with the medial board 430. Additionally, the alignment pins on the module 102 and the alignment board holes 494 may be used to align the module 102 with the medial board 430 in place of the frame 428 aligning the module 102 with the medial board 430. Likewise, the frame 428 may align the module 102 with the PCB 106.

In some embodiments, the alignment board holes 494 may be omitted. In these embodiments, the frame 428 and/or the alignment pins 224 may be used to align the module 102 with the medial board 430 and the PCB 106. In these embodiments, the frame 428 and the alignment pins 224 aligning the module 102 with the medial board 430 may increase a tolerance level of planarity variation within the BMA 100.

Additionally, in some embodiments, the solder layer 422 may be omitted. In these embodiments, the beam grid electrical connections 164 may make direct contact with the PCB 106. Additionally, the medial board 430, when the solder layer 422 is omitted, may be electrically coupled to the PCB 106 but not mechanically coupled top the PCB 106. Additionally or alternatively, an additional beam grid may be electrically coupled to the PCB 106 and the beam grid electrical connections 164. The additional beam grid may be employed for electrically coupling the PCB 106 and the beam grid electrical connections 164 through additional beam grid electrical connections.

The present invention may be embodied in other specific forms without departing from its essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A module mount interposer comprising:
   one or more fastener receivers configured to mechanically couple with one or more fasteners so as to mechanically and electrically couple a module to an interposer;
   a core configured to electrically couple with the module, wherein each of the fastener receivers is mechanically coupled to a first face of the core; and
   a solder layer including:
      a plurality of electrical connections electrically coupled to the core and configured to electrically couple with a printed circuit board (PCB) so as to provide an electrical signal from the module to the PCB and to provide an electrical signal from the PCB to the module; and
      a plurality of solder ball connectors mechanically coupled to a second face of the core, the plurality of solder ball connectors located directly opposite the fastener receivers.

2. The module mount interposer of claim 1, further comprising one or more alignment pins configured to align the module when the module is mechanically and electrically coupled to the interposer.

3. A module mount mechanism including the module mount interposer of claim 1 and one or more fasteners.

4. The module mount mechanism of claim 3, wherein each of the fasteners include a head and each of the fasteners pass through a corresponding hole defined by the module, wherein the head of the fasteners are oversized compared to the corresponding holes defined by the module and the heads urge the module towards the interposer.

5. The module mount mechanism of claim 3, wherein each of the fasteners comprises a bolt and the each of the fastener receivers comprises a nut.

6. The module mount mechanism of claim 5, wherein each of the nuts comprises a surface mount technology (SMT) nut.

7. The module mount mechanism of claim 3, wherein each of the fasteners and nuts are electrically coupled to a ground plane in the core which is electrically coupled to a ground plane in the PCB.

8. The module mount interposer of claim 1, wherein the core is configured as a square and the fastener receivers comprise four fastener receivers located at different corners of the core.

9. The module mount interposer of claim 1 wherein the core is configured to electrically couple with the module through a beam grid when the module is mechanically and electrically coupled to the interposer.

10. A module mount frame system comprising:
    a frame including one or more fastener receivers mechanically coupled to a first face of the frame, the one or more fastener receivers configured to mechanically couple with one or more fasteners so as to mechanically couple a module to a frame;
    a medial board comprising a core configured to electrically couple with the module; and
    a solder layer including:
       a plurality of electrical connections electrically coupled to the core and configured to electrically couple with a PCB so as to provide an electrical signal from the module to the PCB and to provide an electrical signal from the PCB to the module; and
       a plurality of solder ball connectors mechanically coupled to a second face of the frame, the plurality of solder ball connectors located directly opposite the fastener receivers.

11. The module mount frame system of claim 10, further comprising one or more alignment pins configured to align the module when the module is mechanically coupled to the frame.

12. A module mount mechanism including the module mount frame system of claim 10 and one or more fasteners.

13. The module mount mechanism of claim 12, wherein each of the fasteners include a head and each of the fasteners pass through a corresponding hole defined by the module, wherein the heads of the fasteners are oversized compared to the corresponding holes defined by the module and the heads urge the module towards the frame and the medial board.

14. The module mount frame system of claim 10, wherein the frame comprises a PCB frame.

15. The module mount frame system of claim 10, wherein the frame comprises a plastic fame.

16. The module mount frame system of claim 10, wherein the core is configured to electrically couple with the module through a beam grid when the module is mechanically coupled to the frame, wherein the frame substantially surrounds the medial board around an outside edge of the medial board without substantially covering a top surface or a bottom surface of the medial board.

17. A module comprising:
    a housing of a module defining a plurality of holes; and a module mount mechanism comprising:
  one or more fasteners; and
  an interposer comprising:
    one or more fastener receivers configured to mechanically couple with the fasteners so as to mechanically couple the housing and electrically couple the module to the interposer;
    a beam grid configured to electrically couple with the module when the module is mechanically and electrically coupled to the interposer;
    a core electrically coupled to the beam grid, wherein the fastener receivers are mechanically coupled to a first face of the core; and
    a solder layer including:
      a plurality of electrical connections electrically coupled to the core and configured to electrically couple with a PCB so as to provide an electrical signal from the module to the PCB and to provide an electrical signal from the PCB to the module; and
      a plurality of solder ball connectors mechanically coupled to a second face of the core, the plurality of solder ball connectors located directly opposite the fastener receivers.

18. The module of claim 17, wherein the interposer further comprises one or more alignment pins configured to align the housing of the module when the module is mechanically and electrically coupled to the interposer.

19. The module of claim 17, wherein each of the fasteners include a head and each of the fasteners pass through a corresponding hole defined by the housing of the module, wherein the heads of the fasteners are oversized compared to the corresponding holes defined by the housing of the module and the heads urge the housing of the module towards the interposer.

20. The module of claim 17, wherein each of the fasteners comprises a bolt and each of the fastener receivers comprises a nut.

* * * * *